(12) United States Patent
Shah et al.

(10) Patent No.: US 12,446,189 B2
(45) Date of Patent: Oct. 14, 2025

(54) COOLING SYSTEM WITH STRATEGICALLY LOCATED BELLOW

(71) Applicant: MARA Holdings, Inc., Las Vegas, NV (US)

(72) Inventors: Jimil M. Shah, Wylie, TX (US); Ashu Swami, Tampa, FL (US); Chandra Katta, Cupertino, CA (US)

(73) Assignee: MARA Holdings, Inc., Las Vegas, NV (US)

( * ) Notice: Subject to any disclaimer, the term of this patent is extended or adjusted under 35 U.S.C. 154(b) by 0 days.

(21) Appl. No.: 18/924,870

(22) Filed: Oct. 23, 2024

(65) Prior Publication Data

US 2025/0126748 A1    Apr. 17, 2025

Related U.S. Application Data

(63) Continuation of application No. PCT/US2024/051590, filed on Oct. 16, 2024, which is a continuation-in-part of application No. 18/381,098, filed on Oct. 17, 2023.

(51) Int. Cl.
H05K 7/20    (2006.01)

(52) U.S. Cl.
CPC ......... H05K 7/203 (2013.01); H05K 7/20327 (2013.01)

(58) Field of Classification Search
CPC .......................... H05K 7/203; H05K 7/20327
See application file for complete search history.

(56) References Cited

U.S. PATENT DOCUMENTS

| | | | |
|---|---|---|---|
| 6,675,887 B2 | 1/2004 | Garner | |
| 2017/0064862 A1 | 3/2017 | Miyoshi | |
| 2018/0020570 A1* | 1/2018 | Fujiwara | ............ H05K 7/20318 |
| 2020/0211925 A1 | 7/2020 | Sato | |
| 2022/0159875 A1 | 5/2022 | Tuma | |
| 2022/0322577 A1 | 10/2022 | Bauchart | |
| 2023/0080447 A1 | 3/2023 | Shah et al. | |
| 2023/0171923 A1 | 6/2023 | Lau | |

FOREIGN PATENT DOCUMENTS

JP    2020107785    7/2020

OTHER PUBLICATIONS

International Search Report and Written Opinion for International Patent Application No. PCT/US2024/051590, 7 pages.
Co-pending U.S. Appl. No. 18/381,098 filed Oct. 17, 2023.
Non-final Office Action in co-pending U.S. Appl. No. 18/381,098 issued on Jul. 1, 2025.

* cited by examiner

*Primary Examiner* — P. Macade Nichols
(74) *Attorney, Agent, or Firm* — Fish IP Law, LLP

(57) ABSTRACT

Systems, methods, and devices for immersion cooling computer hardware are disclosed. An immersion cooler includes a tank enclosing a condenser and holding an operating liquid, with a head space over a surface of the liquid in the tank. The head space is gaseously coupled to one or more bellows. One or more of the bellows is placed inside the tank. In some cases, the one or more of the bellows is placed inside the head space.

18 Claims, 5 Drawing Sheets

COOLING SYSTEM WITH STRATEGICALLY LOCATED BELLOW

This application is a by-pass continuation-in-part of PCT application PCT/US2024/051590 filed Oct. 16, 2024, which claims benefit and priority to U.S. patent application Ser. No. 18/381,098 filed on Oct. 17, 2023, both of which are incorporated herein by reference in their entirety.

FIELD OF THE INVENTION

The field of the invention is immersion cooling systems.

BACKGROUND

The following description includes information that can be useful in understanding the present invention. It is not an admission that any of the information provided herein is prior art or relevant to the presently claimed invention, or that any publication specifically or implicitly referenced is prior art.

Many modern fast computing rigs contain simple to complex heat exchange or heat transfer systems. In two-phase immersion cooling, a dielectric operating fluid extracts heat from heat generating components (e.g., compute nodes/electronics) and gets converted into vapor. Such operating fluids are generally non-flammable, thermally conductive, dielectric, low boiling point fluorochemicals. As the name suggests, the operating fluid (which is used herein to include one or more evaporable compositions) is in equilibrium between liquid and gaseous forms at the saturation temperature. This vapor gets condensed by a condenser placed over the heat generating components, and the condensate (liquid operating fluid) is sent back to the tank. Heat is removed at the facility level through the coolant flowing through the condenser.

When computing nodes in contact with the operating fluid generate heat, the fluid starts boiling due to a low boiling point and turns to vapor. As vapor starts moving towards the top of the chamber it comes in contact with the condenser, in which the coolant or water is flowing. Vapor starts condensing and the condensate is sent back to the tank, and the cycle repeats. The process is passive and follows natural convection at the system level.

Vapor that is not cooled by the condenser or is in equilibrium with the water temperature of the condenser, passes above the condenser and into the head space. The head space includes air and potentially other gasses that are non-condensable at the working temperatures, moisture in equilibrium with the atmosphere air, and the vapor described above.

During start-up of the cooling system, the operating fluid degasses, and the dissolved air starts getting released from the fluid. That air also rises into the head space. The head space then has pre-existing air, mixtures generated from start-up (non-condensed vapor and degassed air) and moisture. Thus, the head space can include the partial pressure of air, partial pressure of moisture, and partial pressure of fluid vapor. This can increase pressure of the system and affect the system in multiple ways, such as increasing the boiling of fluid (affecting the thermal performance), applying pressure on the tank wall, and stress seals and gaskets (causing leaks from the tank).

During operation there can be power fluctuations. For example, the compute nodes can over-clock, which can generate more vapor and increase the pressure, or the compute nodes can reduce their performance or stop working, leading towards reduction in vapor generation and thus creating vapor loss. These and other situations, (e.g. compute node stops running; reducing heat; reducing generation of vapor; reducing inlet water temperature of condenser or increase in the flow rate; lid opening for maintenance or servicing, etc.), produce pressure/stress within the tank.

Such pressures/stresses can be compensated with a balloon type bellows arrangement, along with a pressure release valve and a breather/intake valve. The use of bellows can provide some extra volumes, reducing fluid lost by otherwise opening a pressure relief valve. Bellows will also deflate to provide the extra volume to the system when the system as a whole cools. Such use of bellows reduces the volume of operating fluid needed to run a cooling system, as well as reduces loss of operating fluid, each of which reduces operating cost and environmental harm inherent with common operating fluids.

One drawback, however, is that the use of bellows increases the size or bulk of cooling systems, reduces density and efficiency of cooling large scale data center or compute farm applications, and increases the relative complexity of such systems. Thus, what is needed are new systems, devices, and methods that ameliorate the added bulk and complexity caused by known bellows applications.

SUMMARY OF THE INVENTION

The inventive subject matter provides apparatus, systems, and methods in which a cooling system uses bellows to reduce a volume of operating fluid required by or lost during immersion cooling, as well as reduce the size, bulk displacement, or footprint of the immersion system.

As used herein, a cooling system includes a tank configured to contain a liquid, with a head space (e.g., vapor head space) above the liquid. One or more bellows is fluidly coupled with the vapor head space and is at least partially disposed or positioned below a bottom of the vapor head space. In some embodiments, the tank has a liquid fill line, and the first bellows is at least partially disposed below the fill line. As used herein, the term "fluidly" includes "gaseously". A high-pressure outlet/relief valve is preferably positioned above a maximum liquid level of an operating fluid in the tank.

Each of the one or more bellows is fluidly coupled with the vapor head space, preferably via a corresponding conduit extending over a top of the tank, for example over the vapor head space. One or more condensers, condensate collectors, and/or heat exchangers can be configured to condense the evaporated liquid passing from the vapor head space to the bellows. The bellows is/are preferably disposed at least partially, mostly, nearly entirely, or entirely below the condenser.

With respect to at least a first bellows, a pump can be configured to pump an amount of the liquid from within the first bellows into the tank. The first bellows can include a drain outlet configured to drain an amount liquid from within the first bellows away from the first bellows or the tank, or both. A heat source, whether external to the system or part of the system (e.g., wall of the tank, heated component in the tank, etc.) can also be configured to heat (e.g., evaporate) an amount of the liquid from within the first bellows into the vapor head space. An insulator can also be used to wrap the first bellows, or at least line a wall of the first bellows opposite a wall of the first bellows thermally coupled with the heat source. Evaporated liquid can migrate to the vapor head space via convection and/or via active modes of conveyance such as fans.

Collectively, the one or more bellows typically has an operating volume of at least 100% of a liquid volume of the tank, in some cases more than 150% or 200% of the volume of the tank. In some embodiments, a plurality of bellows in the system have at least 100%, 150%, 200%, or more of the volume of the tank. One or more of the contemplated bellows can expand and contract vertically, horizontally, or in a combination thereof. In some embodiments, first and second bellows are disposed on opposite sides of the tank, though some or all of the bellows can be disposed on the same side of the tank.

The bellows is/are preferably positioned below the tank, and/or within an external recess of the tank. Removal of liquid collecting in the first bellows can be accomplished in any suitable manner. For example, a pump can be fluidly coupled to the bellows chamber to pump any condensed liquid back into the tank. Collected liquid can additionally or alternatively be evaporated by thermal coupling with the tank, a heated component within the tank, or some other heat source.

The bellows and/or fluid/gas passageways to the bellows are preferably insulated to further prevent cooling/condensing of vapor in the bellows. A condensate collector can also be coupled between the tank and the first bellow, optionally with a drain outlet to remove a condensed liquid. Alternatively, or in combination, thermal elements can be coupled with parts of the system (e.g., a condensate collector, the tank, the bellows, fluid/gas conduits, etc.) to regulate a pressure of the system by cooling or heating the system.

Some aspects of the disclosure provide a cooling system comprising a tank configured to contain a liquid, with a head space above the liquid, and a first bellows is gaseously coupled with the head space and is at least partially disposed below a bottom of the head space. In some cases, the first bellows is gaseously coupled with the head space via a conduit that extends over a top of the tank. In some cases, the disclosed cooling system further comprises a condenser configured to condense heated liquid passing from the head space to the first bellows. In some cases, the disclosed cooling system further comprises a condenser configured to provide cooling to the liquid, and wherein the first bellows is disposed at least partially below the condenser. In some cases, the disclosed cooling system further comprises a heat exchanger configured to provide cooling to the liquid, and wherein the first bellows is disposed entirely below the heat exchanger. In some cases, the disclosed cooling system further comprises a condenser configured to condense heated liquid passing from the head space to the first bellows. In some cases, the disclosed cooling system further comprises a pump configured to pump an amount of the liquid from within the first bellows into the tank. In some instances, the first bellows includes a drain outlet configured to drain an amount liquid from within the first bellows away from the tank. In some cases, the disclosed cooling system further comprises a heat source configured to heat an amount of the liquid from within the first bellows into the head space. In some cases, the heat source comprises a wall of the tank. In some cases, the disclosed cooling system further comprises an insulator against a side of the bellows opposite to a side of the bellows against the heat. In some cases, the first bellows has an operating volume of at least 100% of a liquid volume of the tank. In some cases, the first bellows has an operating volume of at least 150% of a liquid volume of the tank. In some cases, the first bellows is configured to expand and contract vertically, horizontally, or both. In some cases, the tank has a fill line, and the first bellows is at least partially disposed below the fill line. In some instances, there is a layer of activated carbon and/or membrane to separate the vapor of the operating fluid from the mixture in the head space attached at the location where the first bellows are gaseously or fluidly coupled with the head space. The activated carbon layer can include micropores, mesopores, or macropores, or any combination thereof. In some instances, there is a desiccant unit to separate the moisture from the mixture in the head space placed at the location where the head space is gaseously or fluidly coupled to the first bellows. In some cases, the vapor of the operating fluid is fluorochemical vapor.

In some instances, the disclosed cooling system further comprises a second bellows that is fluidly or gaseously coupled with the head space, and at least partially disposed below the bottom of the head space. In some instances, the first and second bellows are disposed on opposite sides of the tank. In some instances, the first and second bellows are disposed on a same side of the tank. In some instances, the disclosed cooling system further comprises a third or fourth bellows that are fluidly or gaseously coupled with the head space. In some instances, the third and fourth bellows partially disposed below the bottom of the head space.

In some instances, the disclosed cooling system further comprises one or more additional bellows located inside the tank. In some instances, the additional bellows is/are located in the head space. In some cases, the additional bellows is/are gaseously or fluidly coupled to the one or more bellows (e.g., the first bellows) located outside the tank below the head space. In some instances, the additional bellows can reduce the volume in the head space and can help reduce the size of the first bellows located below the head space. In some cases, the additional bellows is/are configured to expand and contract vertically, horizontally, or both. In some cases, there is a pressure release valve between the first bellows and the additional bellows.

Some aspects of the disclosure provide a cooling system comprising a tank configured to contain a liquid, with a head space above the liquid; and a first bellows gaseously coupled with the head space, wherein the first bellows is at least partially inside the tank. In some cases, the first bellows is at least partially disposed in the head space. In some cases, the first bellows is entirely disposed in the head space. In some cases, the first bellows is entirely disposed in the tank. In some cases, the first bellows is configured to expand and contract vertically. In some cases, the first bellows is configured to expand and contract horizontally. In some cases, the first bellows is gaseously coupled with the head space through an opening on the side of the first bellows. In some cases, the first bellows is gaseously coupled with the head space through an opening at the bottom of the first bellows. In some instances, the disclosed cooling system further comprises a second bellows gaseously coupled with the head space. In some cases, the second bellows is gaseously coupled with the head space through the first bellows. In some cases, second bellows is located outside the tank. In some cases, the second bellows is located at least partially below the head space. In some cases, the second bellows is located entirely below the head space. In some instances, the disclosed cooling system further comprises a pressure release valve between the first bellows and the second bellows.

Various objects, features, aspects and advantages of the inventive subject matter will become more apparent from the following detailed description of preferred embodiments, along with the accompanying drawing figures in which like numerals represent like components.

DETAILED DESCRIPTION

The inventive subject matter provides apparatus, systems, and methods in which a cooling system uses bellows to reduce a volume of operating fluid required by or lost during immersion cooling, as well as reduce the size, bulk displacement, or footprint of the immersion system.

The following discussion provides many example embodiments of the inventive subject matter. Although each embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Figure 1:
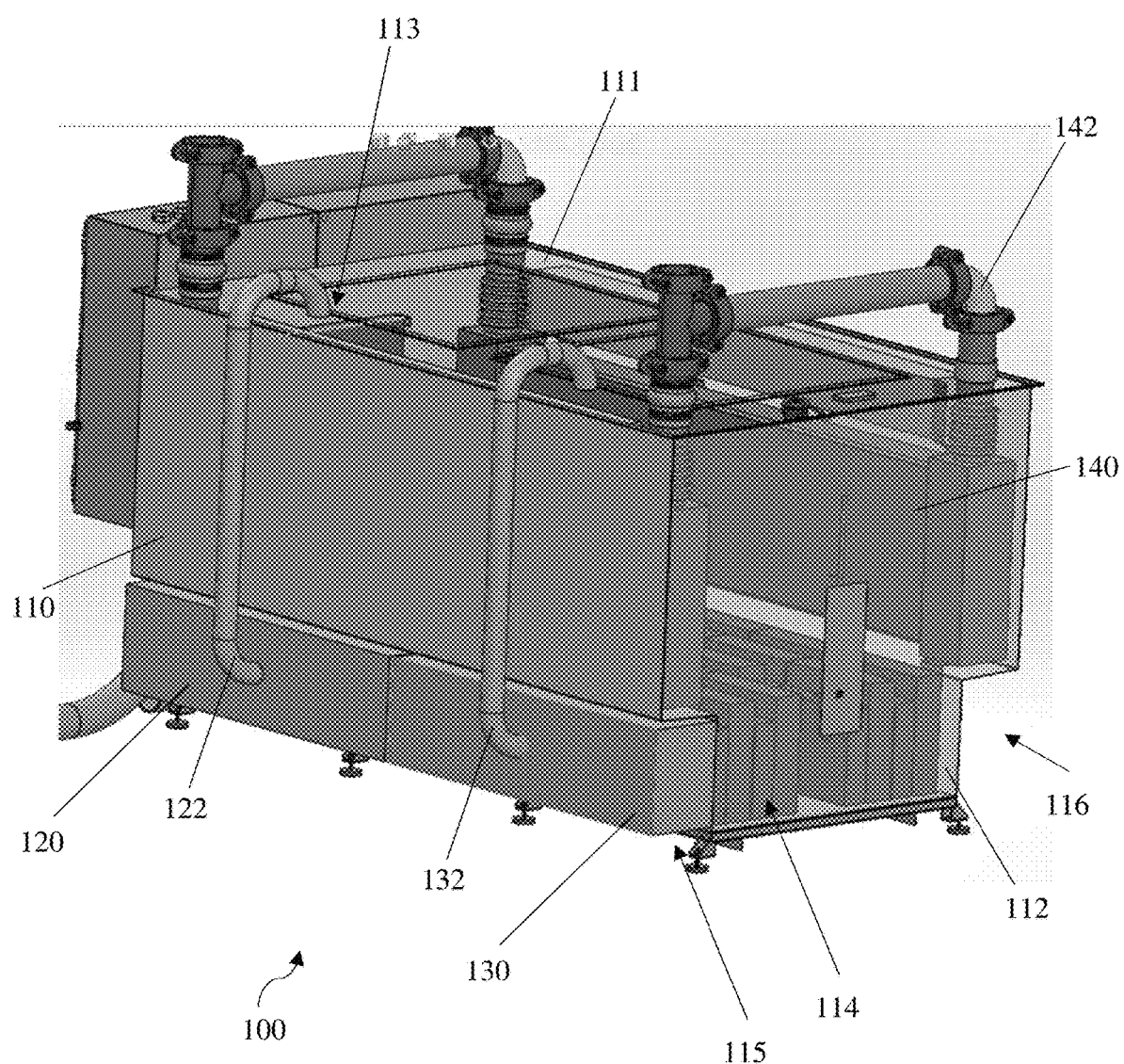
FIG. 1 is a perspective view of an immersion cooling system of the inventive subject matter.

FIG. 1 depicts immersion cooling system 100 having tank 110, bellows chamber 120, and bellows chamber 130. Tank 110 contains an operating fluid (e.g., non-flammable, thermally conductive, dielectric, low boiling point operating fluid, etc., not pictured) in liquid phase in the bulk of tank 110 with a head space 113 above the operating fluid. Head space 113 is generally mostly gaseous (e.g., more than 50%, 75%, or 90% gaseous, etc.) and includes vapor of the operating fluid as well as moisture, water vapor, or other ambient or additive vapors/gases. Tank 110 includes top plate 111, bounding a top of head space 113, and a side plate 112, here depicted as transparent. Operating hardware 114 (e.g., crypto miners, data center hardware, computer hardware, etc.) is also enclosed within tank 110 and submerged in the operating fluid.

Condenser 140 (seen through transparent lid of tank 110) is also enclosed in tank 110 and submerged in the operating fluid. Condenser 140 is coupled with coolant conduit 142, which operate with a coolant to remove or reduce thermal energy from the operating fluid and tank 110. The exterior of tank 110 includes recesses 115 and 116 at the bottom of tank 110, and adjacent operating hardware 114.

FIG. 1 depicts bellows chamber 120 and 130 positioned substantially below tank 110 within recess 115. While FIG. 1 depicts two bellows within recess 115, a single bellows system is contemplated positioned entirely, mostly, or at least partially below tank 110 and in recess 115, as well as more than two bellows below tank 110, for example in both recess 115 and 116. Conduit 122 couples bellows chamber 120 to the head space of tank 110 (head space 113), while conduit 132 couples bellows chamber 130 to the head space.

The inventive assembly of FIG. 1 reduces the bulk space or footprint required for operation, maintenance, or installation of cooling system 100. However, as gas from head space 113 passes between bellows chambers 120 and 130 and tank 110, vapors within the gas (or other heated or evaporated liquids) can condense in conduits 122 or 132, or within chambers 120 and 130, ultimately accumulating liquid within chambers 120 or 130, or the bellows within each chamber. Such accumulation of liquid is undesirable, and can be mitigated by a number of methods, including heating conduits 122 or 132, or chambers 120 or 130 (e.g., via external heat source or heat from tank 110 or operating hardware 114), cooling conduits 122 or 132, or chambers 120 or 130 to condense and remove fluids, using a drain or pump to remove accumulated liquid from chambers 120 or 130, or conduits 122 or 132.

Figure 2:
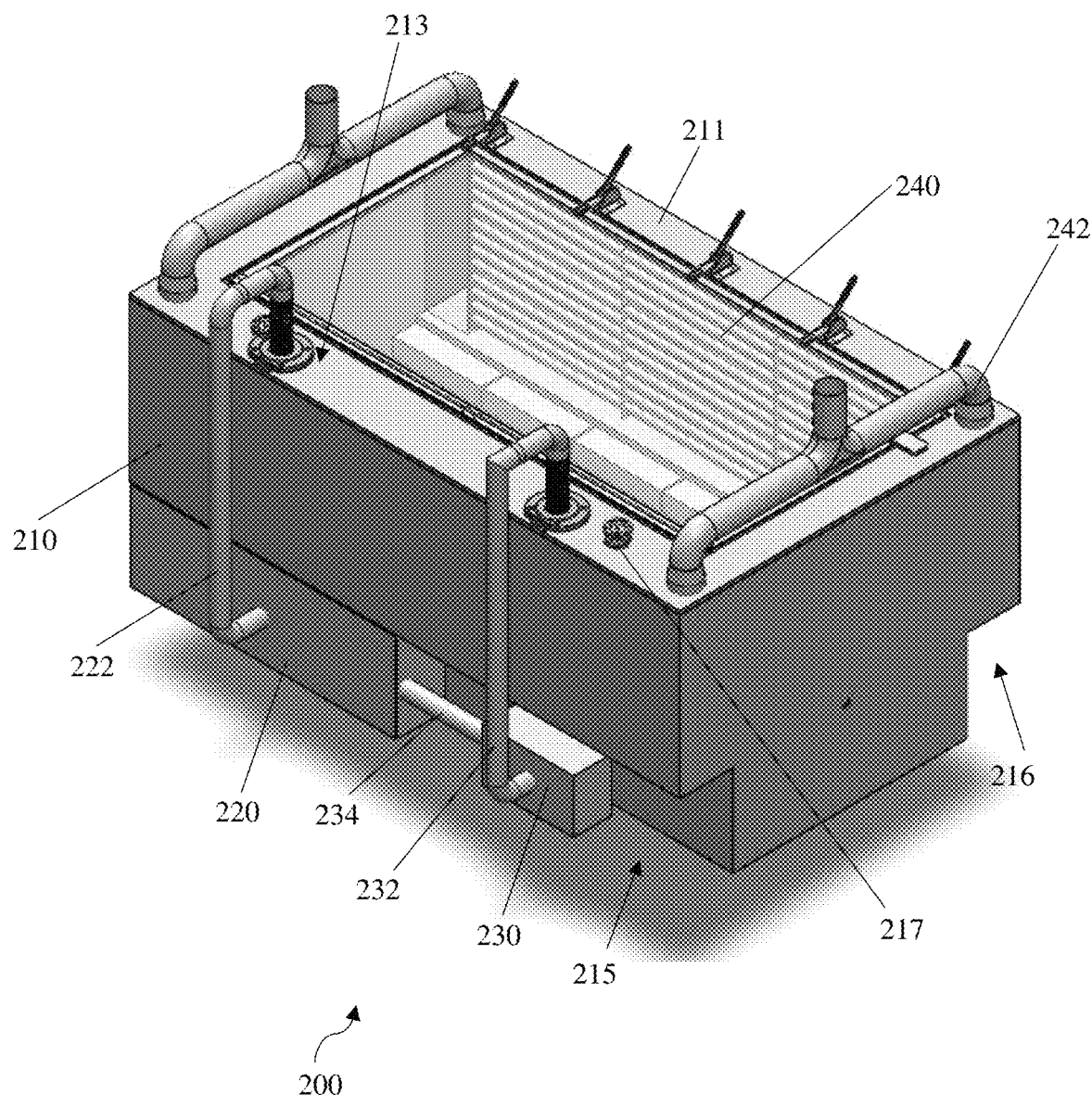
FIG. 2 is a perspective view of another immersion cooling system of the inventive subject matter.

Condenser 240 (seen through transparent lid of FIG. 2 depicts immersion cooling system 200 having tank 210, bellows chamber 220, and condenser 230. Tank 210 contains an operating fluid in liquid phase in the bulk of tank 210, with head space 213 within the tank and above the operating fluid. Head space 213 is generally mostly gaseous (e.g., more than 50%, 75%, or 90% gaseous, etc.) and includes vapor of the operating fluid as well as moisture, water vapor, or other ambient or additive vapors. Tank 210 includes top plate 211, bounding a top of head space 213. Operating hardware (e.g., crypto miners, data center hardware, computer hardware, etc., not depicted) is enclosed within tank 210 and submerged in the operating fluid. System 200 includes valves 217 disposed on top plate 211 to permit air to vent into head space 213 and system 200 as needed. Tank 210 further includes recesses 215 and 216 at the bottom of the tank.

Condenser 240 (seen through transparent lid of tank 210) is also enclosed in tank 210 and submerged in the operating fluid. Condenser 240 is coupled with coolant conduit 242, which operate with a coolant to remove or reduce thermal energy from the operating fluid and tank 210. The exterior of tank 210 includes recesses 215 and 216 at the bottom of tank 210.

FIG. 2 depicts bellows chamber 220 positioned substantially below tank 210 and within recess 215. While FIG. 2 depicts one bellows chamber within recess 215, multiple bellows chambers are contemplated entirely, mostly, or at least partially positioned below tank 210, in recess 215 or recess 216, alone or in combination. Conduit 222 couples bellows chamber 220 to the head space of tank 210 (head space 213).

Condenser 230 is also depicted in recess 215 below tank 210. Condenser 230 is coupled to head space 213 by conduit 232, and further coupled to bellows chamber 220 by conduit 234.

As with FIG. 1, as gas from head space 213 passes between bellows chamber 220 and tank 210, vapors within the gas can condense in chamber 220 or intervening conduits, ultimately accumulating liquid within conduits, chamber 220, or the bellows within the chamber. As such accumulation of liquid is undesirable, it can be mitigated by a number of methods. Here, condenser 230 is included to condense vapors into liquid and capture the liquid, preventing accumulation of liquid in chamber 220. In some embodiments, a heating element is used instead of condenser 230 to maintain prevent liquid from condensing from the vapor. Further, a pump can be coupled to chamber 220 and tank 210 to return condensed liquid from chamber 220 to tank 210.

Figure 3:
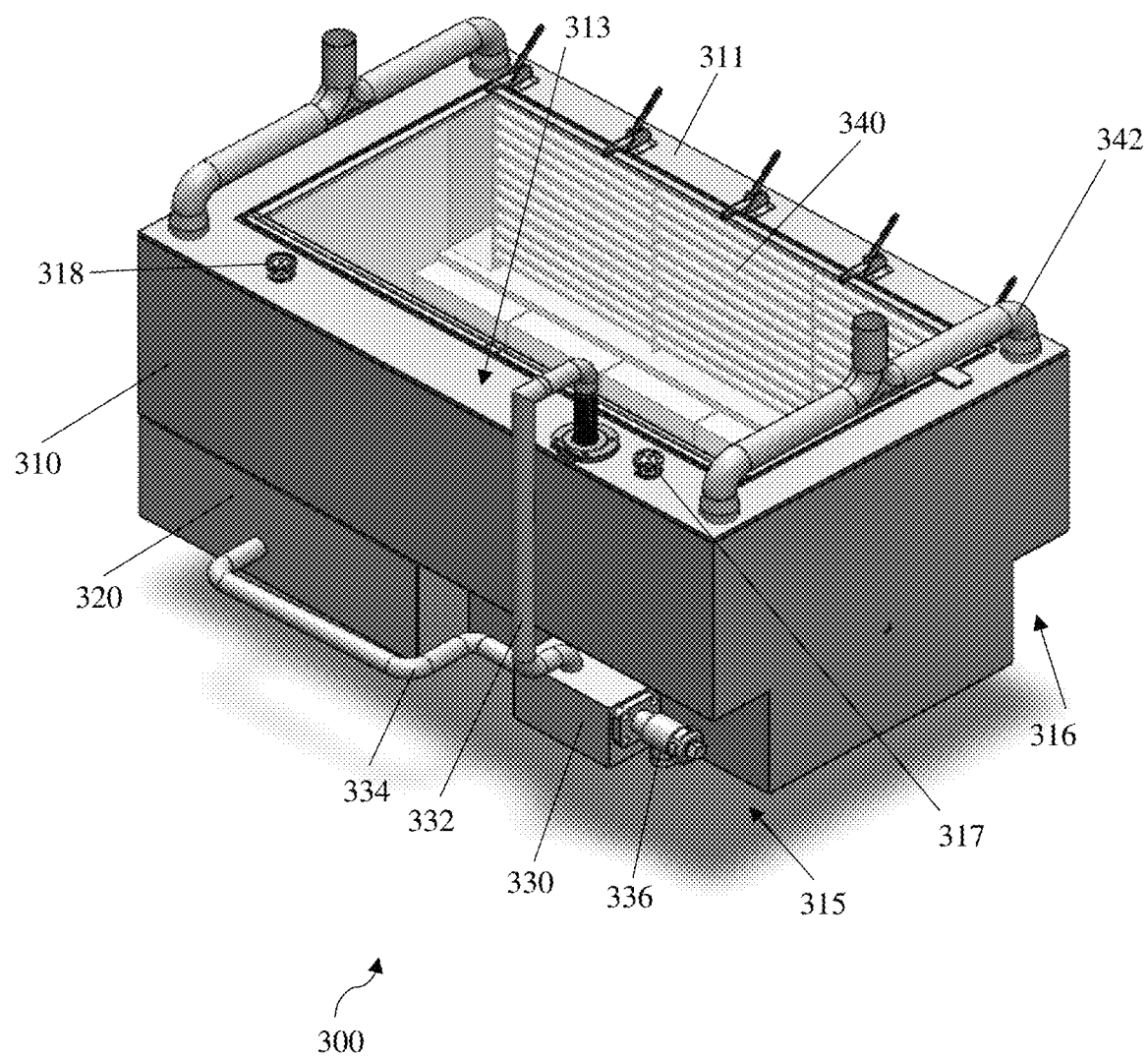
FIG. 3 is a perspective view of yet another immersion cooling system of the inventive subject matter.

FIG. 3 depicts immersion cooling system 300 having tank 310, bellows chamber 320, and condenser 330. Tank 310 contains an operating fluid in liquid phase in the bulk of tank 310, with head space 313 within the tank and above the operating fluid. Head space 313 is generally mostly gaseous (e.g., more than 50%, 75%, or 90% gaseous, etc.) and includes vapor of the operating fluid as well as moisture, water vapor, or other ambient or additive vapors. Tank 310 includes top plate 311, bounding a top of head space 313. Operating hardware (e.g., crypto miners, data center hardware, computer hardware, etc., not depicted) is enclosed within tank 310 and submerged in the operating fluid. System 300 includes valves 317 and 318 disposed on top plate 311 to permit air to vent into head space 313 and system 300 as needed. Tank 310 further includes recesses 315 and 316 at the bottom of the tank.

Condenser 340 (seen through transparent lid of tank 310) is also enclosed in tank 310 and submerged in the operating fluid. Condenser 340 is coupled with coolant conduit 342, which operate with a coolant to remove or reduce thermal energy from the operating fluid and tank 310. The exterior of tank 310 includes recesses 315 and 316 at the bottom of tank 310.

FIG. 3 depicts bellows chamber 320 positioned substantially below tank 310 and within recess 315. While FIG. 3 depicts one bellows chamber within recess 315, multiple bellows chambers are contemplated entirely, mostly, or at least partially positioned below tank 310, in recess 315 or recess 316, alone or in combination. Condenser 330 is also depicted in recess 315 below tank 310. Condenser 330 is coupled to head space 313 by conduit 332, and further coupled to bellows chamber 320 by conduit 334. Drain 336 is further coupled with condenser 330 and can be used to remove collected liquid from the system.

As with FIGS. 1 and 2, as gas from head space 313 passes between bellows chamber 320 and tank 310, vapors within the gas can condense in chamber 320 or intervening conduits, ultimately accumulating liquid within conduits, chamber 320, or the bellows within the chamber. As such accumulation of liquid is undesirable, it can be mitigated by a number of methods. Here, condenser 330 is included to condense vapors into liquid and capture the liquid. Drain 336 is further coupled to condenser 330 to remove captured liquid, preventing accumulation of liquid in chamber 320. In some embodiments, a heating element is used instead of condenser 330 to maintain prevent liquid from condensing from the vapor.

Figure 4:
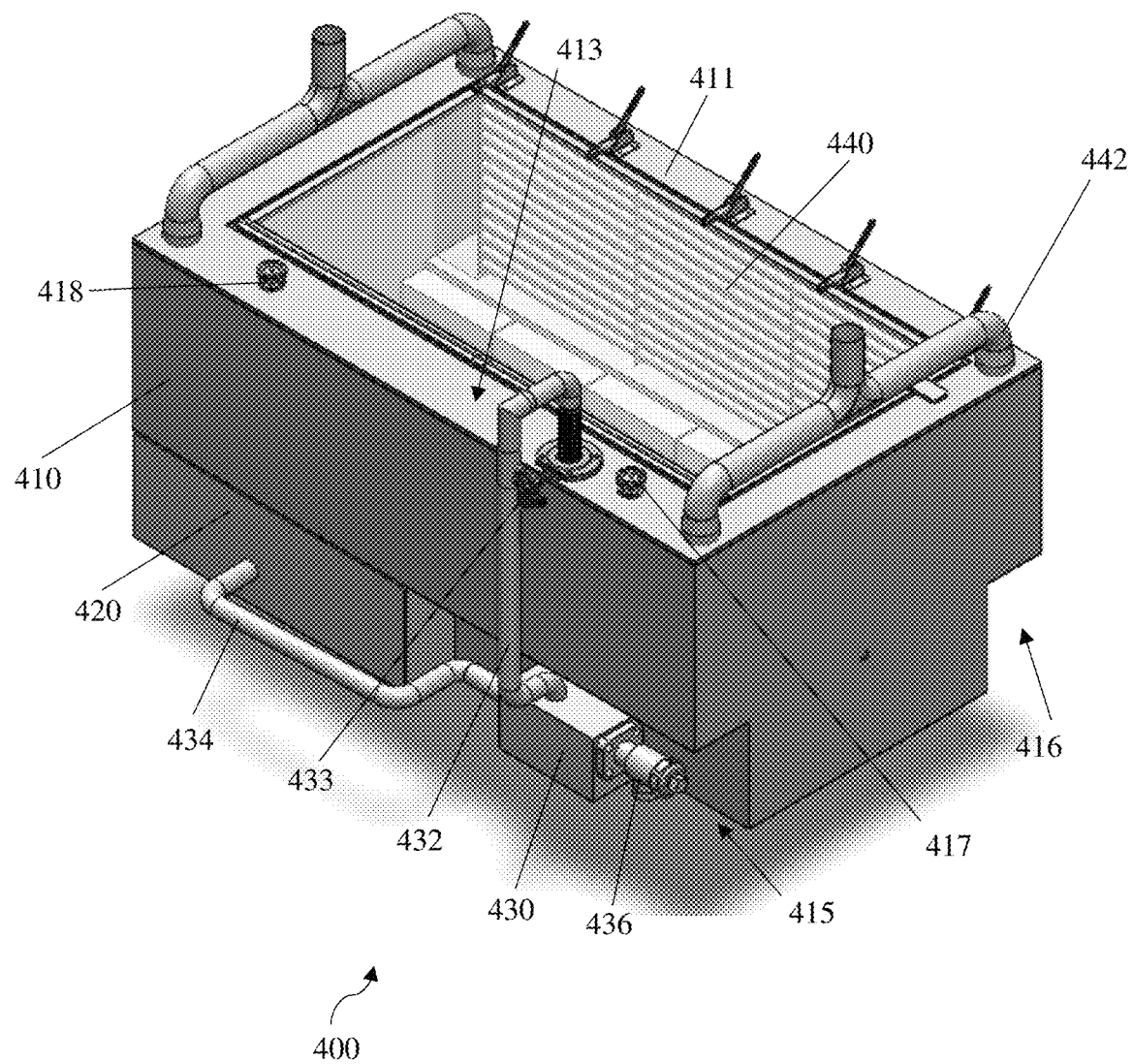
FIG. 4 is a perspective view of still another immersion cooling system of the inventive subject matter.

FIG. 4 depicts immersion cooling system 400 having tank 410, bellows chamber 420, and condenser 430. System 400 is similar to system 300 of FIG. 3, with the addition of pressure valve 433 on conduit 432 to release or otherwise regulate pressure of system 400.

Tank 410 contains an operating fluid in liquid phase in the bulk of tank 410, with head space 313 within the tank and above the operating fluid. Head space 413 is generally mostly gaseous (e.g., more than 50%, 75%, or 90% gaseous, etc.) and includes vapor of the operating fluid as well as moisture, water vapor, or other ambient or additive vapors. Tank 410 includes top plate 411, bounding a top of head space 413. Operating hardware (e.g., crypto miners, data center hardware, computer hardware, etc., not depicted) is enclosed within tank 410 and submerged in the operating fluid. System 400 includes valves 417 and 418 disposed on top plate 411 to permit air to vent into head space 413 and system 400 as needed. Tank 410 further includes recesses 415 and 416 at the bottom of the tank.

Condenser 440 (seen through transparent lid of tank 410) is enclosed in tank 410 and submerged in the operating fluid. Condenser 440 is coupled with coolant conduit 442, which operate with a coolant to remove or reduce thermal energy from the operating fluid and tank 410. The exterior of tank 410 includes recesses 415 and 416 at the bottom of tank 410.

FIG. 4 depicts bellows chamber 420 and Condenser 430 as described in FIG. 3. Condenser 430 is coupled to head space 413 by conduit 432, and further coupled to bellows chamber 420 by conduit 434. Drain 436 is further coupled with condenser 430 and can be used to remove collected liquid from the system.

As used herein, a high boiling point operating fluid has at least one component with a lowest boiling point of at least 55° C., and in various different contemplated embodiments, at least one component with a lowest boiling point of at least 61° C., at least 75° C., at least 100° C., at least 150° C., or at least 180° C. Exemplary high boiling point (single-phase fluids) include Fluorochemicals like 3M FC 40 (B.P. 165/170C), 3M FC 3283 (B.P. 128C) and Hydrocarbon oils like Shell GTL S3X and S5X, PAOs by Chevron, ExxonMobil, PAO blends like Engineered Fluids EC 100™, GRC's Electrosafe™, Submer's Smart Coolant™, Lubrizol's Compuzol™, Esters, synthetic esters, silicon oils, etc.

Exemplary operating fluids (e.g., low boiling point fluids) include 3M FC 72 (B.P. 56C), 3M FC 3284 (B.P. 49C), Solvay Galden HT™ 55 (B.P. 55C), 3M Novec 7000™ (B.P. 34C), 3M Novec 7100™ (B.P. 61C), Novec 649™ (B.P. 49C) and chemistries such as PFCs, HFEs, FKs, HFOs, etc.

Figure 5:
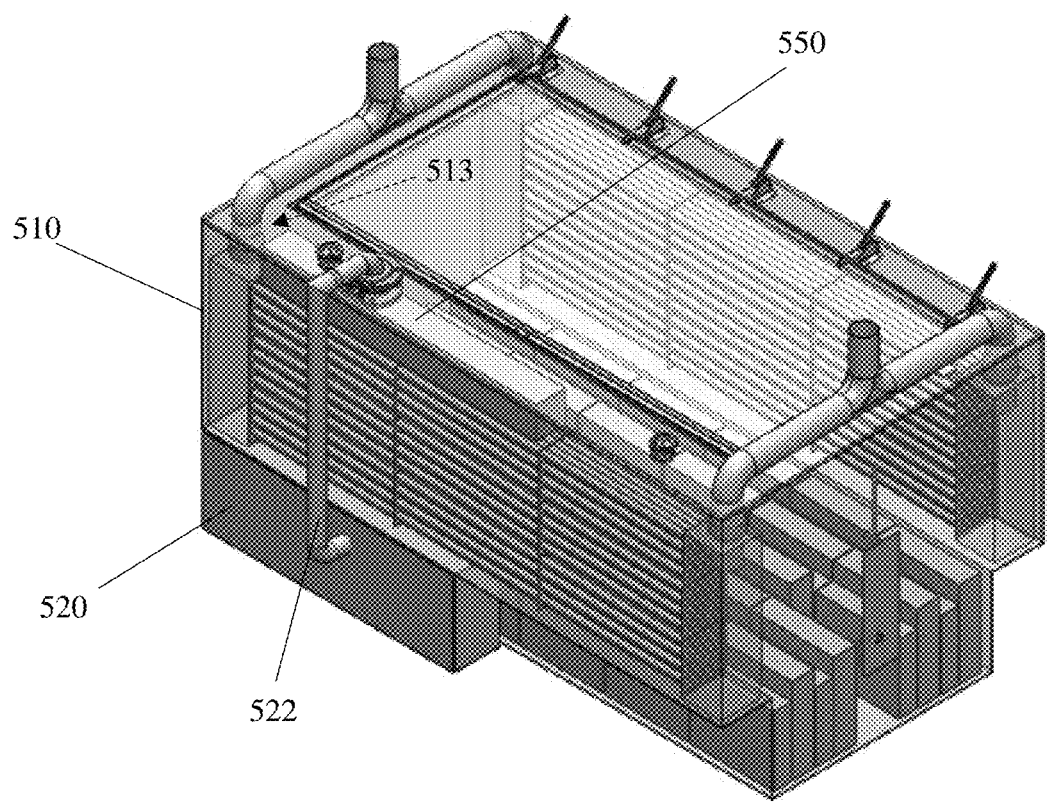
FIG. 5 is a perspective view of another immersion cooling system of the inventive subject matter having a bellows inside the tank.

In FIG. 5, immersion cooling system 500 has a bellows 550 that is placed inside the tank 510. In some cases, the bellows chamber 550 is placed inside the head space 513. The bellows chamber 550 can be configured to expand and contract vertically, horizontally, or both. The bellows chamber 550 is fluidly or gaseously coupled to the head space 513 through an opening (e.g., on the side or at the bottom, not shown in this perspective). The bellows chamber 550 is fluidly or gaseously coupled to the bellows chamber 520 through pipe 522. In some cases, there is a pressure release valve (not shown) between the bellows chamber 520 and the bellows chamber 550.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps can be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

The recitation of ranges of values herein is merely intended to serve as a shorthand method of referring individually to each separate value falling within the range. Unless otherwise indicated herein, each individual value is incorporated into the specification as if it were individually recited herein, and ranges include their endpoints.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention can contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention. Unless a contrary meaning is explicitly stated, all ranges are inclusive of their endpoints, and open-ended ranges are to be interpreted as bounded on the open end by commercially feasible embodiments.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

What is claimed is:

1. A cooling system, comprising:
   a tank configured to contain a liquid, with a head space above the liquid;
   a first bellows gaseously coupled with the head space, wherein the first bellows is at least partially inside the tank; and
   a second bellows gaseously coupled with the head space, wherein the second bellows is located outside the tank.

2. A cooling system, comprising:
   a tank configured to contain a liquid, with a head space above the liquid;
   a first bellows gaseously coupled with the head space, wherein the first bellows is at least partially inside the tank;
   a second bellows gaseously coupled with the head space, and
   a pressure release valve between the first bellows and the second bellows.

3. The cooling system of claim 1, wherein the first bellows is at least partially disposed in the head space.

4. The cooling system of claim 1, wherein the first bellows is entirely disposed in the head space.

5. The cooling system of claim 1, wherein the first bellows is entirely disposed in the tank.

6. The cooling system of claim 1, wherein the first bellows is configured to expand and contract vertically.

7. The cooling system of claim 1, wherein the first bellows is configured to expand and contract horizontally.

8. The cooling system of claim 1, wherein the first bellows is gaseously coupled with the head space through an opening on the side of the first bellows.

9. The cooling system of claim 1, wherein the first bellows is gaseously coupled with the head space through an opening at the bottom of the first bellows.

10. The cooling system of claim 1, wherein the second bellows is gaseously coupled with the head space through the first bellows.

11. The cooling system of claim 2, wherein the first bellows is at least partially disposed in the head space.

12. The cooling system of claim 2, wherein the first bellows is entirely disposed in the head space.

13. The cooling system of claim 2, wherein the first bellows is entirely disposed in the tank.

14. The cooling system of claim 2, wherein the first bellows is configured to expand and contract vertically.

15. The cooling system of claim 2, wherein the first bellows is configured to expand and contract horizontally.

16. The cooling system of claim 2, wherein the first bellows is gaseously coupled with the head space through an opening on the side of the first bellows.

17. The cooling system of claim 2, wherein the first bellows is gaseously coupled with the head space through an opening at the bottom of the first bellows.

18. The cooling system of claim 2, wherein the second bellows is gaseously coupled with the head space through the first bellows.

* * * * *

UNITED STATES PATENT AND TRADEMARK OFFICE
CERTIFICATE OF CORRECTION

| | |
|---|---|
| PATENT NO. | : 12,446,189 B2 |
| APPLICATION NO. | : 18/924870 |
| DATED | : October 14, 2025 |
| INVENTOR(S) | : Jimil M. Shah, Ashu Swami and Chandra Katta |

It is certified that error appears in the above-identified patent and that said Letters Patent is hereby corrected as shown below:

On the Title Page

Related U.S. Application Data (63) "Continuation of application No. PCT/US2024/051590, filed on Oct. 16, 2024, which is a continuation-in-part of application No. 18/381,098, filed on Oct. 17, 2023." should read "Continuation-in-part of application No. PCT/US2024/051590, filed on Oct. 16, 2024, which is a continuation-in-part of application No. 18/381,098, filed on Oct. 17, 2023."

Signed and Sealed this
Twenty-third Day of December, 2025

John A. Squires
*Director of the United States Patent and Trademark Office*